(12) United States Patent
Cheng et al.

(10) Patent No.: US 7,973,326 B2
(45) Date of Patent: Jul. 5, 2011

(54) SEMICONDUCTOR STRUCTURE COMBINATION FOR EPITAXY OF SEMICONDUCTOR OPTOELECTRONIC DEVICE

(75) Inventors: Chih-Ching Cheng, Taichung (TW); Tzong-Liang Tsai, Taichung (TW)

(73) Assignee: HUGA Optotech Inc., Taichung (TW)

( * ) Notice: Subject to any disclaimer, the term of this patent is extended or adjusted under 35 U.S.C. 154(b) by 525 days.

(21) Appl. No.: 11/987,640

(22) Filed: Dec. 3, 2007

(65) Prior Publication Data
US 2009/0001394 A1 Jan. 1, 2009

(30) Foreign Application Priority Data

Jun. 29, 2007 (TW) .............................. 96123799 A

(51) Int. Cl.
*H01L 33/00* (2010.01)
(52) U.S. Cl. ............... 257/97; 257/14; 257/94; 257/96; 257/E33.012; 438/22; 438/46
(58) Field of Classification Search .................. 257/97, 257/101, 14, 94.96, 98, 99, E33.012; 438/22, 438/46, 47
See application file for complete search history.

(56) References Cited

U.S. PATENT DOCUMENTS

| | | | |
|---|---|---|---|
| 5,472,907 A | 12/1995 | Binsma et al. | |
| 5,805,630 A | 9/1998 | Valster et al. | |
| 6,072,189 A | 6/2000 | Duggan | |
| 6,103,542 A | 8/2000 | Pomp et al. | |
| 6,316,785 B1 * | 11/2001 | Nunoue et al. | 257/14 |

FOREIGN PATENT DOCUMENTS

| | | |
|---|---|---|
| JP | 01-149455 | 6/1989 |
| JP | 04-22177 | 1/1992 |
| JP | 2004-128107 | 4/2004 |
| TW | 200302574 | 8/2003 |
| TW | 584962 | 4/2004 |
| TW | 200721551 | 6/2007 |

OTHER PUBLICATIONS

"Office Action of Taiwan Counterpart Application", issued on Feb. 24, 2011, p. 1-p. 5, in which the listed references were cited.

* cited by examiner

*Primary Examiner* — Thinh T Nguyen
(74) *Attorney, Agent, or Firm* — Jianq Chyun IP Office

(57) ABSTRACT

The invention discloses a semiconductor structure combination for the epitaxy of a semiconductor optoelectronic device and manufacture thereof. The semiconductor structure combination according to the invention includes a substrate and a semiconductor material. The substrate has an upper surface and a recess formed on the upper surface. The sidewalls of the recess provide a first site for the growth of a plurality of first epitaxial crystals of the semiconductor material toward a first preferred orientation. A bottom of the recess provides a second site for the growth of a second epitaxial crystal of the semiconductor material toward the first preferred orientation. Flat regions adjacent to the recess provide a third site for the growth of a third epitaxial crystal of the semiconductor material toward the first preferred orientation.

15 Claims, 6 Drawing Sheets

SEMICONDUCTOR STRUCTURE COMBINATION FOR EPITAXY OF SEMICONDUCTOR OPTOELECTRONIC DEVICE

BACKGROUND OF THE INVENTION

1. Field of the Invention

The present invention relates to a semiconductor structure combination and, more particularly, to a semiconductor structure combination for a semiconductor optoelectronic device.

2. Description of the Prior Art

The current semiconductor light-emitting devices, such as light-emitting diodes, have been used for a wide variety of applications, e.g. illumination, remote control. To ensure high functional reliability as great as possible and a low power requirement of the semiconductor light-emitting devices, the external quantum efficiency is required for the devices.

In theory, the external quantum efficiency of a semiconductor light-emitting device is determined by the internal quantum efficiency thereof. The internal quantum efficiency is determined by the material property and quality. If a density of inner defects of the semiconductor light-emitting device becomes higher, it will lower the internal quantum efficiency and light-extraction efficiency of the semiconductor light-emitting device.

To enhance the external quantum efficiency of the semiconductor light-emitting device, a sapphire substrate with a patterned surface has been disclosed and applied to the manufacture of the semiconductor light-emitting device. The patterned surface is for scattering light emitted out from the semiconductor light-emitting device to reduce the probability of a total reflection, and further enhancing the external quantum efficiency of the semiconductor light-emitting device.

Although a semiconductor material layer, e.g. GaN, can be formed on the patterned surface of the sapphire substrate by a good lateral epitaxy, many inner defects, e.g. formed-through dislocations, are still generated after the epitaxy of the semiconductor material layer on the patterned surface of the sapphire substrate and affect the optoelectronic performance of the semiconductor light-emitting device directly. Therefore, the quality of the semiconductor material layer formed on the patterned surface of the sapphire substrate is still required of improvement.

Therefore, the main scope of the invention is to provide a semiconductor structure combination for a semiconductor optoelectronic device to solve the above problems.

SUMMARY OF THE INVENTION

One scope of the invention is to provide a semiconductor structure combination for the epitaxy of a semiconductor optoelectronic device.

According to an embodiment of the invention, the semiconductor structure combination includes a substrate, a plurality of first epitaxial crystals of a semiconductor material, a second epitaxial crystal of the semiconductor material, and a third epitaxial crystal of the semiconductor material. The substrate has an upper surface and a recess formed on the upper surface.

Sidewalls of the recess provide a first site for the growth of a semiconductor material in a first preferred orientation. A bottom of the recess provides a second site for the growth of the semiconductor material in the first preferred orientation. Flat regions adjacent to the recess provide a third site for the growth of the semiconductor material in the first preferred orientation.

The first epitaxial crystals are nucleated at the first site and grow toward the first preferred orientation under a first process condition. The second epitaxial crystal is nucleated at the second site and grows toward the first preferred orientation under the first process condition. The third epitaxial crystal is nucleated at the third site and grows toward the first preferred orientation under the first process condition.

According to another embodiment of the invention, it is related to a semiconductor structure combination. The semiconductor structure combination includes a substrate, a plurality of first epitaxial crystals of a semiconductor material, a second epitaxial crystal of the semiconductor material, and a third epitaxial crystal of the semiconductor material. The substrate has an upper surface and a recess formed on the upper surface.

Sidewalls of the recess provide a first site for the growth of a semiconductor material in a first preferred orientation. A bottom of the recess provides a second site for the growth of the semiconductor material in the first preferred orientation. Flat regions adjacent to the recess provide a third site for the growth of the semiconductor material in the first preferred orientation.

The first epitaxial crystals are nucleated at the first site and grow toward the first preferred orientation under a process condition. The second epitaxial crystal is nucleated at the second site and grows toward the first preferred orientation under the process condition. The third epitaxial crystal is nucleated at the third site and grows toward the first preferred orientation under the process condition.

Under the process condition, the first epitaxial crystals and the third epitaxial crystal continue growing toward the first preferred orientation under the process condition to form a layer of the semiconductor material overlaying the substrate, and a sealed void is formed at a top of the recess.

According to another embodiment of the invention, it is related to a semiconductor structure combination. The semiconductor structure combination includes a substrate, a plurality of first epitaxial crystals of a semiconductor material, a second epitaxial crystal of the semiconductor material, and a third epitaxial crystal of the semiconductor material. The substrate has an upper surface and a recess formed on the upper surface.

Sidewalls of the recess provide a first site for the growth of the semiconductor material. A bottom of the recess provides a second site for the growth of the semiconductor material. Flat regions adjacent to the recess provide a third site for the growth of the semiconductor material.

The first epitaxial crystals are nucleated at the first site. The second epitaxial crystal is nucleated at the second site. The third epitaxial crystal is nucleated at the third site. The third epitaxial crystal is to form a layer of the semiconductor material overlaying the substrate, and the first epitaxial crystals are located between the second epitaxial crystal and the third epitaxial crystal.

Compared to the prior art, the density of inner defects of the semiconductor structure combination according to the invention can be decreased, and the semiconductor structure combination can be applied to manufactures of semiconductor optoelectronic devices to enhance the optoelectronic performance thereof.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
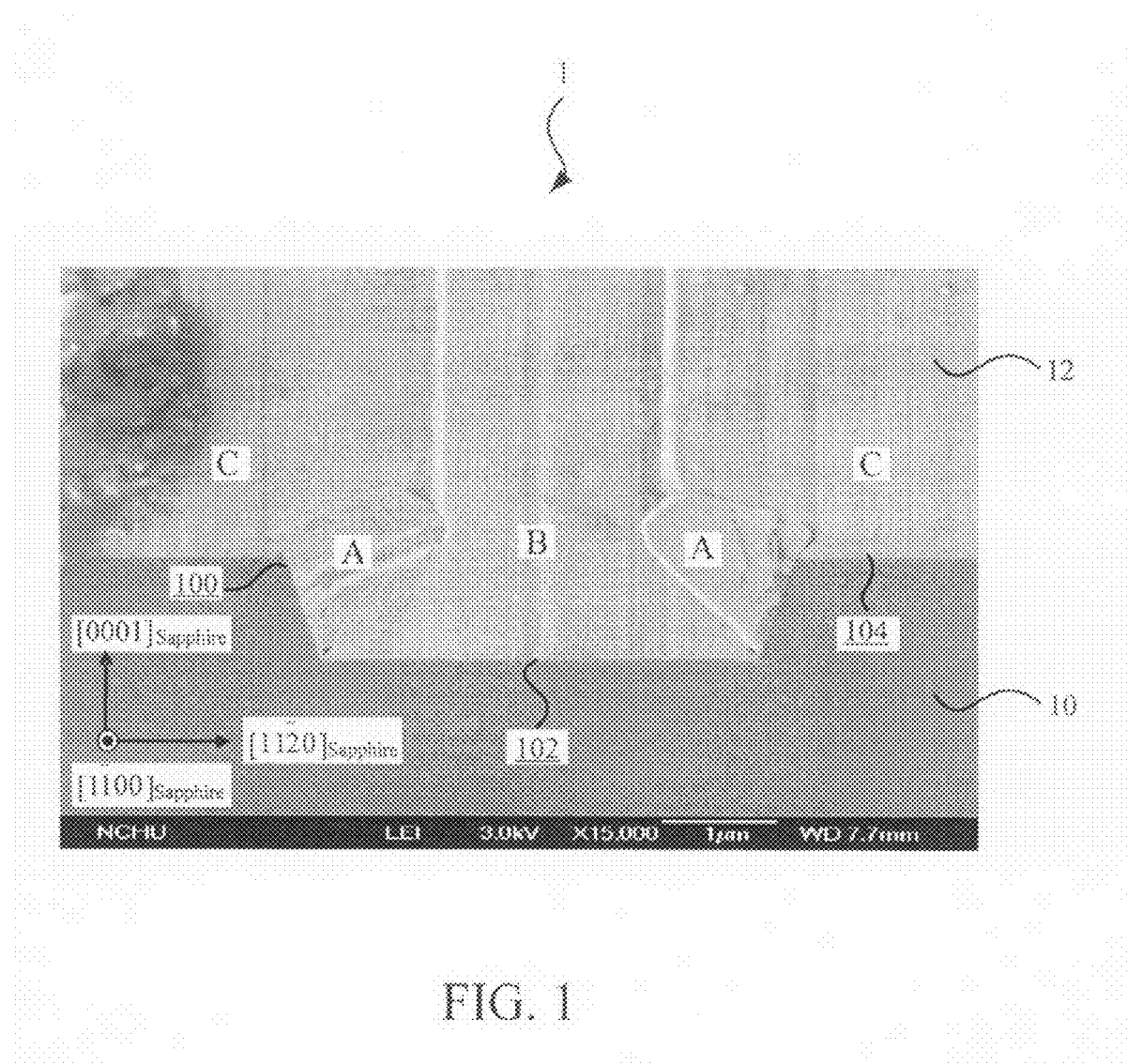
FIG. 1 is an SEM cross-sectional view of a semiconductor structure combination according to an embodiment of the invention for the epitaxy of a semiconductor optoelectronic device.

Please refer to FIG. 1. FIG. 1 is an SEM cross-sectional view of a semiconductor structure combination 1 according to an embodiment of the invention for the epitaxy of a semiconductor optoelectronic device.

The semiconductor structure combination 1 includes a substrate 10, a plurality of first epitaxial crystals A of a semiconductor material 12, a second epitaxial crystal B of the semiconductor material 12, and a third epitaxial crystal C of the semiconductor material 12. The substrate 10 has an upper surface and a recess formed on the upper surface.

In practical applications, the substrate 10 can be Si, $SiO_2$, GaN, AlN, sapphire, spinnel, SiC, GaAs, $Al_2O_3$, $LiGaO_2$, $LiAlO_2$, or $MgAl_2O_4$.

Sidewalls 100 of the recess provide a first site for the growth of a semiconductor material 12 toward a first preferred orientation. A bottom 102 of the recess provides a second site for the growth of the semiconductor material 12 toward the first preferred orientation. Flat regions 104 adjacent to the recess provide a third site for the growth of the semiconductor material 12 toward the first preferred orientation.

In practical applications, the semiconductor material 12 can be III-V group compound semiconductor material 12. The III group chemical element in the III-V group compound semiconductor material 12 can be B, Al, Ga or In. And, the V group chemical element in the III-V group compound semiconductor material 12 can be N, P, As or Sb.

In the embodiment, the substrate 10 can be a sapphire substrate 10, and the upper surface of the sapphire substrate 10 has a crystallographic surface orientation of (0001). In addition, the semiconductor material 12 can be GaN, and the first preferred orientation can be $\{0001\}_{GaN}$.

In practical applications, the semiconductor structure combination 1 further includes a film of GaN overlaying the upper surface of the sapphire substrate 10 before the formation of the first epitaxial crystals A, the second epitaxial crystal B and the third epitaxial crystal C. In one embodiment, the film of GaN can have a thickness of at least 200 Å.

The first epitaxial crystals A are nucleated at the first site and grow toward the first preferred orientation under a first process condition. In one embodiment, the first process condition can include a first process temperature of 900° C. and a first process pressure of 200 torrs.

The second epitaxial crystal B is nucleated at the second site and grows toward the first preferred orientation under the first process condition. The third epitaxial crystal C is nucleated at the third site and grows toward the first preferred orientation under the first process condition.

In particular, under the first process condition, the growth of the second epitaxial crystal B and the third epitaxial crystal C inhibit the growth of the first epitaxial crystals A. In the embodiment, the second epitaxial crystal B can have a height higher than the depth of the recess.

Afterwards, the second epitaxial crystal B and the third epitaxial crystal C continue growing toward a second preferred orientation under a second process condition to form a layer of the semiconductor material 12 overlaying the substrate 10. In the embodiment, the second preferred orientation can be $\{11\bar{2}0\}_{GaN}$. In one embodiment, the second process condition can include a second process temperature of 1050° C. and a second process pressure of 200 torrs.

Figure 2:
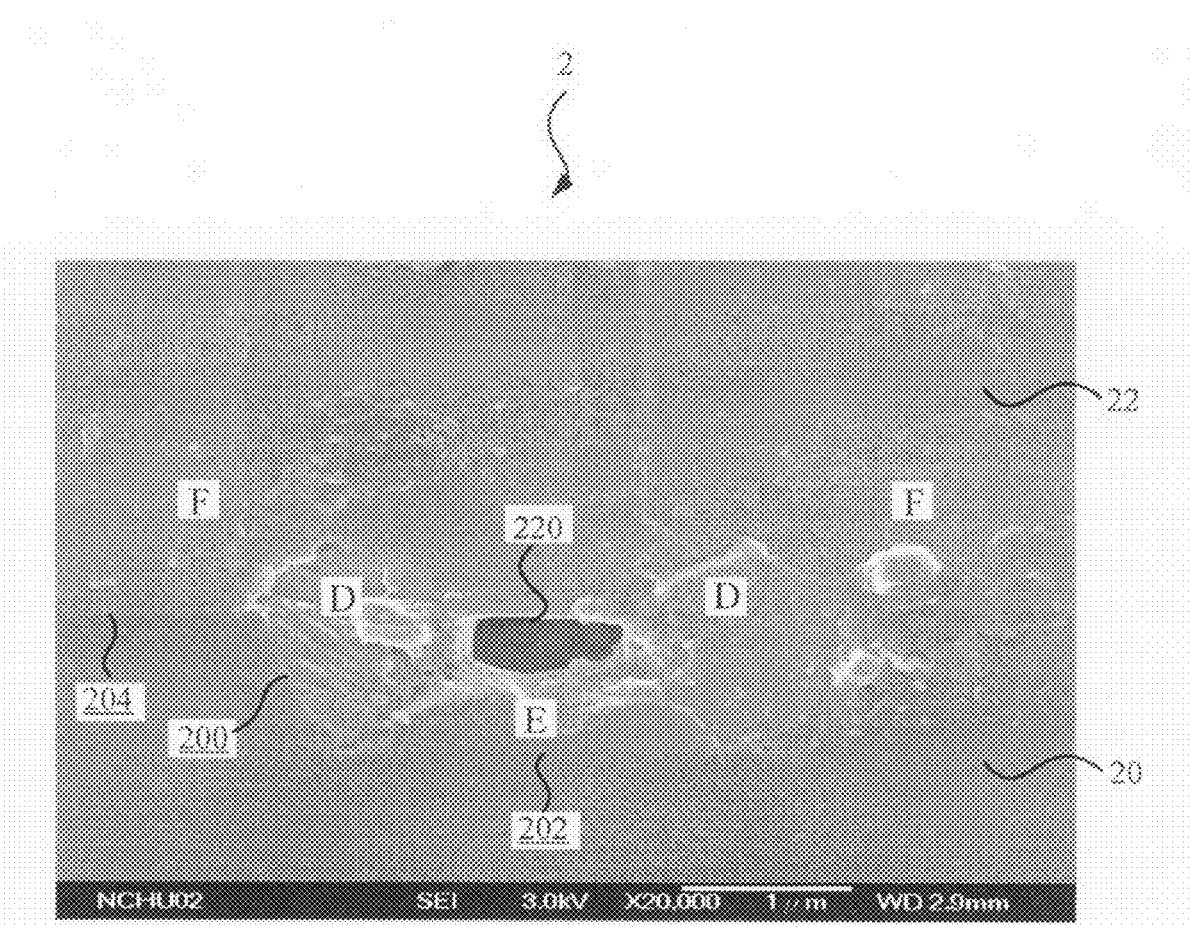
FIG. 2 is an SEM cross-sectional view of a semiconductor structure combination according to another embodiment of the invention for the epitaxy of a semiconductor optoelectronic device.

Please refer to FIG. 2. FIG. 2 is an SEM cross-sectional view of a semiconductor structure combination 2 according to another embodiment of the invention for the epitaxy of a semiconductor optoelectronic device.

As shown in FIG. 2, the semiconductor structure combination 2 includes a substrate 20, a plurality of first epitaxial crystals D of a semiconductor material 22, a second epitaxial crystal E of the semiconductor material 22, and a third epitaxial crystal F of the semiconductor material 22. The substrate 20 has an upper surface and a recess formed on the upper surface.

Sidewalls 200 of the recess provide a first site for the growth of a semiconductor material 22 toward a first preferred orientation. A bottom 202 of the recess provides a second site for the growth of the semiconductor material 22 toward the first preferred orientation. Flat regions 204 adjacent to the recess provide a third site for the growth of the semiconductor material 22 toward the first preferred orientation.

In the embodiment, the substrate 20 can be a sapphire substrate 20, and the upper surface of the sapphire substrate 20 has a crystallographic surface orientation of (0001). In addition, the semiconductor material 22 can be GaN, and the first preferred orientation can be $\{11\bar{2}0\}_{GaN}$.

The first epitaxial crystals D are nucleated at the first site and grow toward the first preferred orientation under a process condition. In one embodiment, the process condition can include a process temperature of 900° C. and a process pressure of 200 torrs.

The second epitaxial crystal E is nucleated at the second site and grows toward the first preferred orientation under the process condition. The third epitaxial crystal F is nucleated at the third site and grows toward the first preferred orientation under the process condition.

Under the process condition, the first epitaxial crystals D and the third epitaxial crystal F continue growing toward the first preferred orientation under the process condition to form a layer of the semiconductor material 22 overlaying the substrate 20, and a sealed void 220 is formed at a top of the recess.

According to another embodiment of the invention, it is related to a semiconductor structure combination (not shown in the figure) for the epitaxy of a semiconductor optoelectronic device. The semiconductor structure combination includes a substrate, a plurality of first epitaxial crystals of a semiconductor material, a second epitaxial crystal of the semiconductor material, and a third epitaxial crystal of the semiconductor material. The substrate has an upper surface and a recess formed on the upper surface.

Sidewalls of the recess provide a first site for the growth of the semiconductor material. A bottom of the recess provides a second site for the growth of the semiconductor material. Flat regions adjacent to the recess provide a third site for the growth of the semiconductor material.

The first epitaxial crystals are nucleated at the first site. The second epitaxial crystal is nucleated at the second site. The third epitaxial crystal is nucleated at the third site. The third epitaxial crystal is to form a layer of the semiconductor material overlaying the substrate, and the first epitaxial crystals are located between the second epitaxial crystal and the third epitaxial crystal.

Figure 3A:
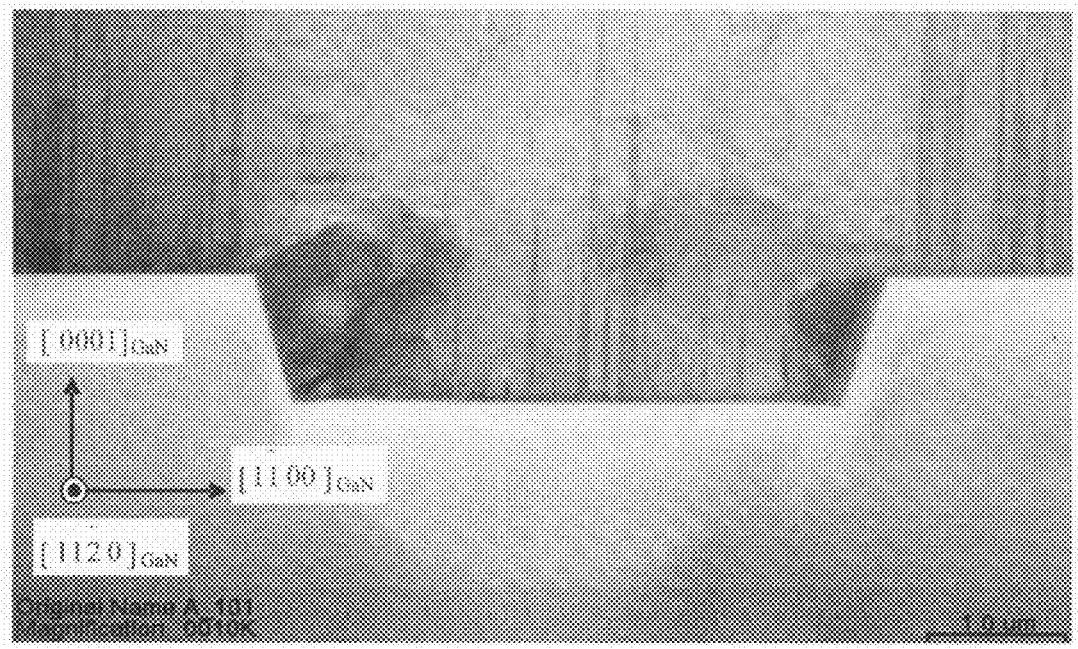
FIG. 3A and FIG. 3B are the TEM cross-sectional views of a semiconductor structure combination according to an embodiment of the invention.

Please refer to FIG. 3A. FIG. 3A is a TEM cross-sectional view of a semiconductor structure combination 1 according to an embodiment of the invention.

As shown in FIG. 3A, dislocations generated on top of the recess of the substrate 10 bend, extend and end at the intersection of the crystal, with a growth orientation different from that of the crystal grown from sidewalls 100 of the recess and the crystal grown from sidewalls 100. However, some partial dislocations at the central part of the recess still extend upward to the surface.

Figure 3B:
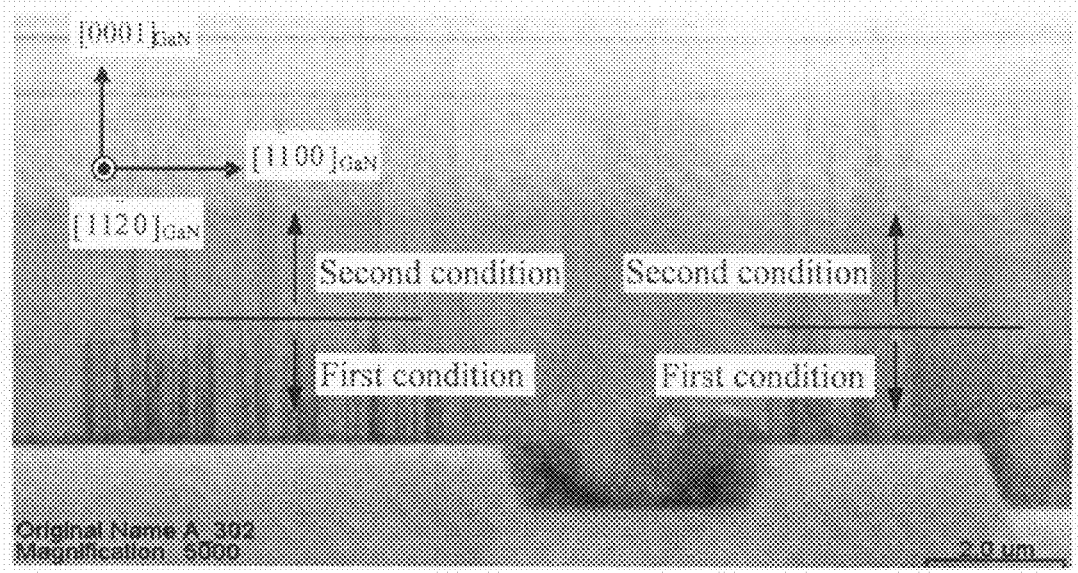

Please refer to FIG. 3B. FIG. 3B is a TEM cross-sectional view of a semiconductor structure combination 1 according to another embodiment of the invention.

As shown in FIG. 3B, two process conditions are adopted by the growth of the semiconductor structure combination 1. The first one is under 900° C., which many dislocations are generated due to lower growth temperature. However, under the second process condition of high temperature and low pressure (i.e. 1050° C.-200 torr), the GaN crystal tends to grow toward the second preferred orientation $\{11\bar{2}0\}_{GaN}$. Consequently, a great amount of the dislocations are obviously bended to the second preferred orientation $\{11\bar{2}0\}_{GaN}$ by a lateral growth, and the number of the dislocations extending upward to the surface is then decreased.

Figure 3C:
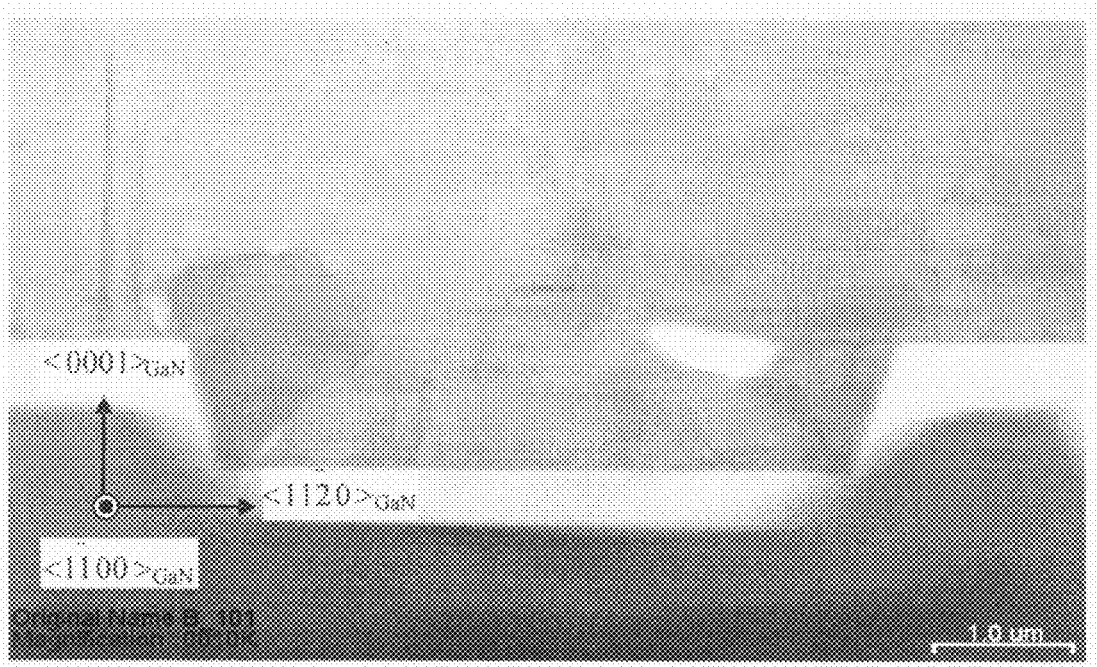
FIG. 3C is a TEM cross-sectional view of a semiconductor structure combination according to another embodiment of the invention.

Please refer to FIG. 3C. FIG. 3C is a TEM cross-sectional view of a semiconductor structure combination 2 according to another embodiment of the invention.

As shown in FIG. 3C, because the semiconductor structure combination 2 tends to grow toward the second preferred orientation $\{11\bar{2}0\}_{GaN}$ initially due to being under the process condition of high temperature an low pressure (i.e. 1050° C.-200 torr), there is almost no upward extending dislocations generated on top of the recess of the substrate 20. Specifically speaking, almost all of the dislocations located on top of the recess of the substrate 20 are bended to the second preferred orientation $\{11\bar{2}0\}_{GaN}$ by the lateral growth, and the density of the dislocations is thus decreased obviously.

Figure 3D:
FIG. 3D is a TEM cross-sectional view of a semiconductor structure combination grown on a substrate without recesses on the upper surface of the substrate.

Please refer to FIG. 3D. FIG. 3D is a TEM cross-sectional view of a semiconductor structure combination grown on a substrate without recesses on the upper surface (i.e. flat surface) of the substrate.

Comparing FIG. 3A, FIG. 3C and FIG. 3D, it is noted that semiconductor structure combinations 1 and 2, grown on the substrates 10 and 20 with recesses on the upper surfaces respectively, have a much lower density of formed-through dislocations than that of the semiconductor structure combination grown on the substrate without recesses on the upper surface, especially for the semiconductor structure combination 2 with a larger-area sealed hole 220 attributed to the initial lateral growth, because of hardly dislocations generated on top of the recess. In particular, the density of the formed-through dislocations of the semiconductor structure combination 2 with the sealed hole 220 is even lower than that of the semiconductor structure combination 1 grown under the two process conditions.

In practical applications, the semiconductor structure combinations 1 and 2 according to the invention can be applied to the manufacture of semiconductor optoelectronic devices, e.g. semiconductor light-emitting devices and optical detectors.

Figure 4A:
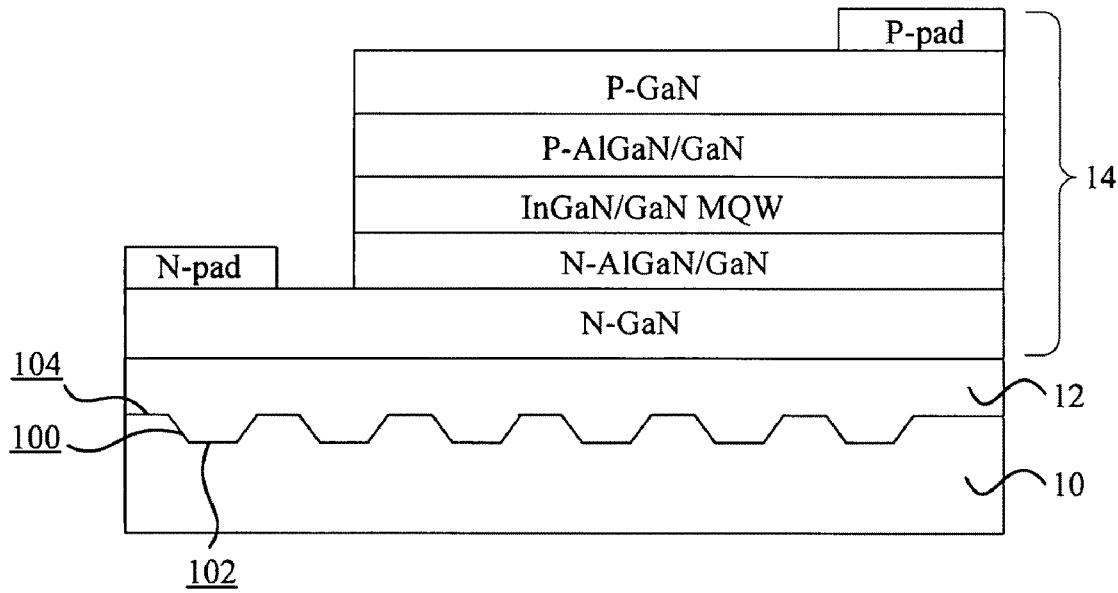
FIG. 4A is a semiconductor light-emitting device based a semiconductor structure combination according to an embodiment of the invention.

In one embodiment, the semiconductor structure combination 1 can be applied to the manufacture of a semiconductor light-emitting device, e.g. LED, which is represented as LED A. Please refer to FIG. 4A. FIG. 4A is a semiconductor light-emitting device based a semiconductor structure combination 1 according to an embodiment of the invention. The semiconductor light-emitting device also includes a multi-layer structure 14, and the material of each layer of the multi-layer structure 14 is shown in FIG. 4A.

Figure 4B:
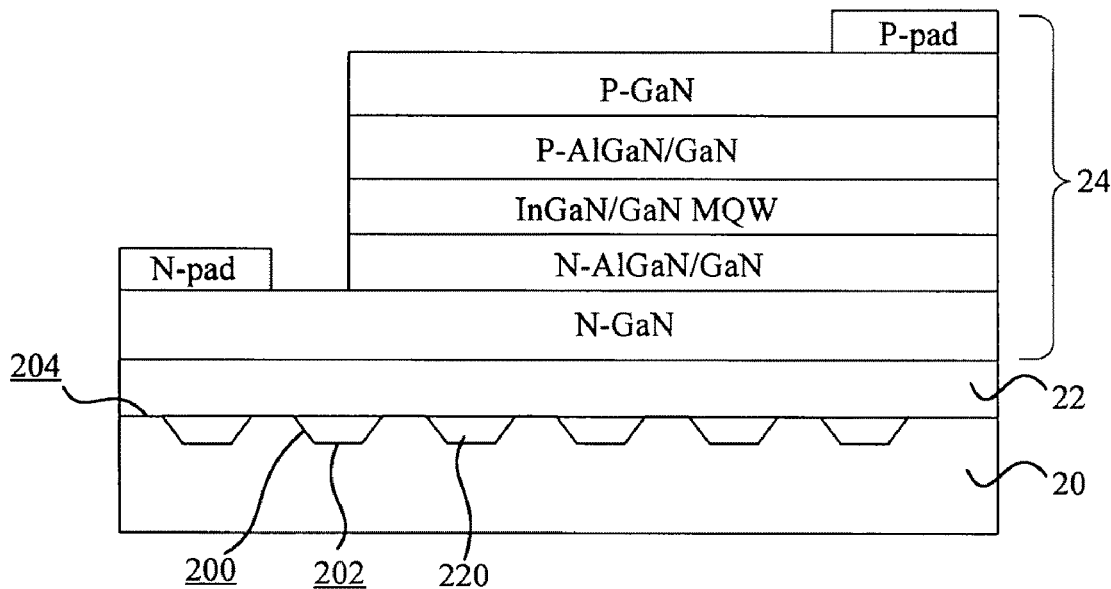
FIG. 4B is a semiconductor light-emitting device based a semiconductor structure combination according to another embodiment of the invention.
Figure 4C:
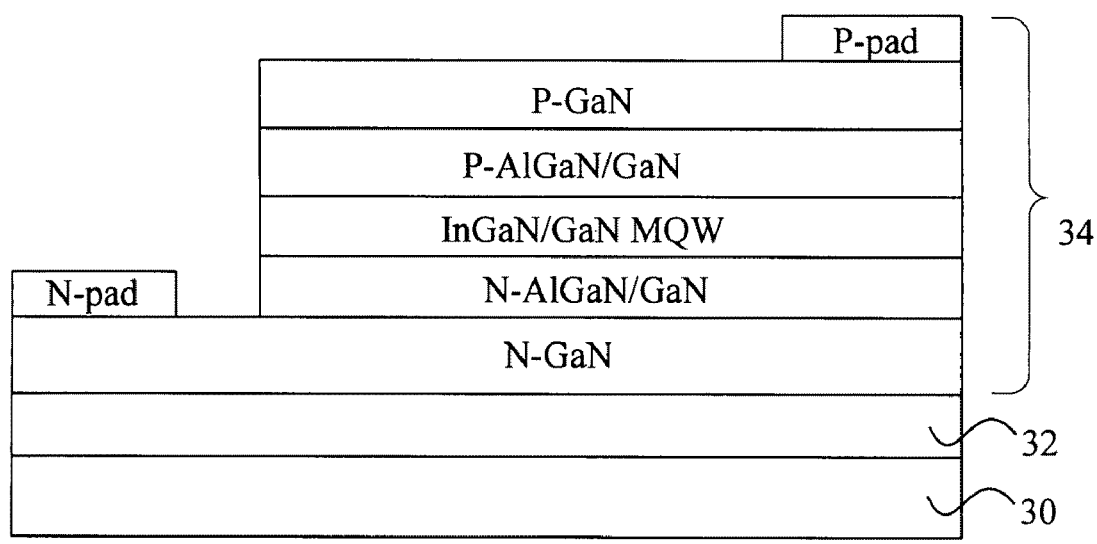
FIG. 4C is a semiconductor light-emitting device grown on a substrate without recesses on the upper surface of the substrate.

The semiconductor structure combination 2 and the semiconductor structure combination grown on a substrate without recesses on the upper surface of the substrate are represented as LED B and LED C, respectively. Please refer to FIG. 4B. FIG. 4B is a semiconductor light-emitting device based on a semiconductor structure combination 2 according to another embodiment of the invention. The semiconductor light-emitting device also includes a multi-layer structure 24, and the material of each layer of the multi-layer structure 24 is shown in FIG. 4B. Please refer to FIG. 4C. FIG. 4C is a semiconductor light-emitting device grown on a substrate 30 without recesses on the upper surface of the substrate 30. The semiconductor light-emitting device also includes a semiconductor material layer 32 and a multi-layer structure 34, and the material of each layer of the multi-layer structure 34 is shown in FIG. 4C.

Please refer to table 1. Table 1 lists the tested results of optoelectronic performances for LED A, LED B and LED C. Because both of the densities of the formed-through dislocations of LED A and LED B are lower than that of LED C, LED A and LED B are then better than LED C in overall optoelectronic performances. For example, the light output power of LED A based on the semiconductor structure combination 1 is enhanced by 33% compared to that of LED C. The light output power of LED B based on the semiconductor structure combination 2 with a sealed hole 220 is enhanced by 25% compared to that of LED C.

TABLE 1

| optoelectronic performances | LED A | LED B | LED C |
| --- | --- | --- | --- |
| Light output power (20 mA) | 12.38 mW | 11.26 mW | 9.3 mW |
| Voltage (20 mA) | 3.32 V | 3.28 V | 3.26 V |
| Reversed withstand voltage (−10 μA) | 27.3 V | 30.45 V | 20.55 V |
| Leakage current (−10 V) | 56 μA | 79 μA | 305 μA |
| Brightness decay after 1000 hours (20 mA) | 12% | 10% | 19% |

Compared to the prior art, the density of inner defects of the semiconductor structure combination according to the invention can be decreased, and the semiconductor structure combination can be applied to the manufacture of semiconductor optoelectronic devices to enhance the optoelectronic performance thereof.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor structure combination for the epitaxy of a semiconductor optoelectronic device, the semiconductor structure combination comprising:
    a substrate having an upper surface and a recess formed on the upper surface, wherein sidewalls of the recess provide a first site for the growth of a semiconductor material toward a first preferred orientation, a bottom of the recess provides a second site for the growth of the semiconductor material toward the first preferred orientation, and flat regions adjacent to the recess provide a third site for the growth of the semiconductor material toward the first preferred orientation;
    a plurality of first epitaxial crystals of the semiconductor material, being nucleated at the first site and growing toward the first preferred orientation under a first process condition, wherein the first epitaxial crystals have a first crystalline orientation which extends toward a center of the recess;
    a second epitaxial crystal of the semiconductor material, being nucleated at the second site and growing toward the first preferred orientation under the first process condition, wherein the second epitaxial crystal has a second crystalline orientation different from the first crystalline orientation; and
    a third epitaxial crystal of the semiconductor material, being nucleated at the third site and growing toward the first preferred orientation under the first process condition, wherein the third epitaxial crystal has a third crystalline orientation different from the first crystalline orientation;
    wherein under the first process condition, the growth of the second epitaxial crystal and the third epitaxial crystal inhibit the growth of the first epitaxial crystals, such that the first epitaxial crystals extend toward the center of the recess without contacting one another, and
    wherein the first epitaxial crystals are located between the second epitaxial crystal and the third epitaxial crystal.

2. The semiconductor structure combination of claim 1, wherein the second epitaxial crystal has a height higher than the depth of the recess.

3. The semiconductor structure combination of claim 1, wherein the substrate is formed of a material selected from the group consisting of Si, $SiO_2$, GaN, AlN, sapphire, spinnel, SiC, GaAs, $Al_2O_3$, $LiGaO_2$, $LiAlO_2$, and $MgAl_2O_4$.

4. The semiconductor structure combination of claim 1, wherein the semiconductor material is a kind of III-V group compound semiconductor material, wherein a III group chemical element in the III-V group compound semiconductor material is one selected from the group consisting of B, Al, Ga and In, and a V group chemical element in the III-V group compound semiconductor material is one selected from the group consisting of N, P, As and Sb.

5. The semiconductor structure combination of claim 1, wherein the substrate is a sapphire substrate, the upper surface of the sapphire substrate has a crystallographic surface orientation of (0001), the semiconductor material is GaN, and the first preferred orientation is $\{0001\}_{GaN}$.

6. The semiconductor structure combination of claim 5, further comprising a film of GaN overlaying the upper surface of the sapphire substrate before the formation of the first epitaxial crystals, the second epitaxial crystal and the third epitaxial crystal.

7. The semiconductor structure combination of claim 6, wherein the film of GaN has a thickness of at least 200 Å.

8. The semiconductor structure combination of claim 5, wherein the second epitaxial crystal and the at lest one third epitaxial crystal continue growing toward a second preferred orientation $\{11\bar{2}0\}_{GaN}$ under a second process condition to form a layer of the semiconductor material overlaying the substrate.

9. The semiconductor structure combination of claim 8, wherein the first process condition comprises a first process temperature of 900° C. and a first process pressure of 200 tons, and the second process condition comprises a second process temperature of 1050° C. and a second process pressure of 200 torrs.

10. A semiconductor structure combination for the epitaxy of a semiconductor optoelectronic device, the semiconductor structure combination comprising:
    a substrate having an upper surface and a recess formed on the upper surface, wherein sidewalls of the recess provide a first site for the growth of a semiconductor material, a bottom of the recess provides a second site for the growth of the semiconductor material, and flat regions adjacent to the recess provide a third site for the growth of the semiconductor material;
    a plurality of first epitaxial crystals of the semiconductor material, being formed at the first site, wherein the first epitaxial crystals have a first crystalline orientation which extends toward a center of the recess;
    a second epitaxial crystal of the semiconductor material, being formed at the second site, wherein the second epitaxial crystal has a second crystalline orientation different from the first crystalline orientation; and
    a third epitaxial crystal of the semiconductor material, being formed at the third site, wherein the third epitaxial crystal has a third crystalline orientation different from the first crystalline orientation;
    wherein the second epitaxial crystal and the third epitaxial crystal are to form a layer of the semiconductor material overlaying the substrate, and the first epitaxial crystals are located between the second epitaxial crystal and the third epitaxial crystal, such that the first epitaxial crystals extend toward the center of the recess without contacting one another.

11. The semiconductor structure combination of claim 10, wherein the substrate is formed of a material selected from the group consisting of Si, $SiO_2$, GaN, AlN, sapphire, spinnel, SiC, GaAs, $Al_2O_3$, $LiGaO_2$, $LiAlO_2$, and $MgAl_2O_4$.

12. The semiconductor structure combination of claim 10, wherein the semiconductor material is a kind of III-V group compound semiconductor material, wherein a III group chemical element in the III-V group compound semiconductor material is one selected from the group consisting of B, Al, Ga and In, and a V group chemical element in the III-V group compound semiconductor material is one selected from the group consisting of N, P, As and Sb.

13. The semiconductor structure combination of claim 10, wherein the substrate is a sapphire substrate, the upper surface of the sapphire substrate has a crystallographic surface orientation of (0001), the semiconductor material is GaN.

14. The semiconductor structure combination of claim 13, further comprising a film of GaN overlaying the upper surface of the sapphire substrate before the formation of the first epitaxial crystals, the second epitaxial crystal and the third epitaxial crystal.

15. The semiconductor structure combination of claim 14, wherein the film of GaN has a thickness of at least 200 Å.

* * * * *